United States Patent
Hinzen

[11] Patent Number: 5,285,597
[45] Date of Patent: Feb. 15, 1994

[54] METHOD AND ARRANGEMENT FOR SUBDIVIDING SEMICONDUCTOR BARS INTO SEMICONDUCTOR WAFERS

[75] Inventor: Hubert Hinzen, Igensdorf, Fed. Rep. of Germany

[73] Assignee: GMN Georg Muller Nurnberg AG, Fed. Rep. of Germany

[21] Appl. No.: 973,060

[22] Filed: Nov. 6, 1992

[30] Foreign Application Priority Data

Nov. 7, 1991 [DE] Fed. Rep. of Germany ....... 4136566

[51] Int. Cl.$^5$ .................. B24B 7/00; B24B 53/02; B28B 5/02; B28B 1/02
[52] U.S. Cl. ........................ 51/5 C; 51/5 D; 51/325; 51/283 R; 125/13.02; 125/11.19
[58] Field of Search ............... 51/5 C, 325, 323, 326, 51/283 R, 5 D; 125/13.01, 13.02, 11.19, 11.01

[56] References Cited

U.S. PATENT DOCUMENTS

| 4,663,890 | 5/1987 | Brandt | 51/283 R |
| 4,881,518 | 11/1989 | Feldmeier | 125/14 |
| 4,894,956 | 1/1990 | Honda et al. | 51/5 B |
| 4,896,459 | 1/1990 | Brandt | 51/5 C |
| 4,947,598 | 8/1990 | Sekiya | 125/11.19 |
| 4,967,461 | 11/1990 | Feldmeier | 29/414 |
| 4,967,725 | 11/1990 | Hinzen | 125/21 |
| 5,074,276 | 12/1991 | Katayama | 51/5 C |
| 5,111,622 | 5/1992 | Steere | 51/5 C |

FOREIGN PATENT DOCUMENTS

| 0106207 | 5/1986 | Japan | 125/13.02 |
| 0232162 | 9/1990 | Japan | 125/11.01 |
| 3184766 | 8/1991 | Japan | 125/11.01 |

Primary Examiner—Bruce M. Kisliuk
Assistant Examiner—Bryan Reichenbach
Attorney, Agent, or Firm—Steinberg & Raskin

[57] ABSTRACT

A device for subdividing semiconductor bars into wafers comprises a grinding tool having two concentrically arranged grinding discs. A rough grinding disc is arranged inside of an outer smooth polishing grinding disc. The grinding tool grinds a lower face of a semiconductor bar to a smooth planar form. A first electrolytic truer operates in conjunction with the outer smooth polishing grinding disc while a second electrolytic truer operates in conjunction with the inner rough grinding disc. The truers are arranged to define an axial offset between the grinding surfaces of the grinding discs so that a lower face of the bar is smoothed. The device also has a slicing tool for slicing the bar into wafers which will have a smooth planar form.

13 Claims, 6 Drawing Sheets

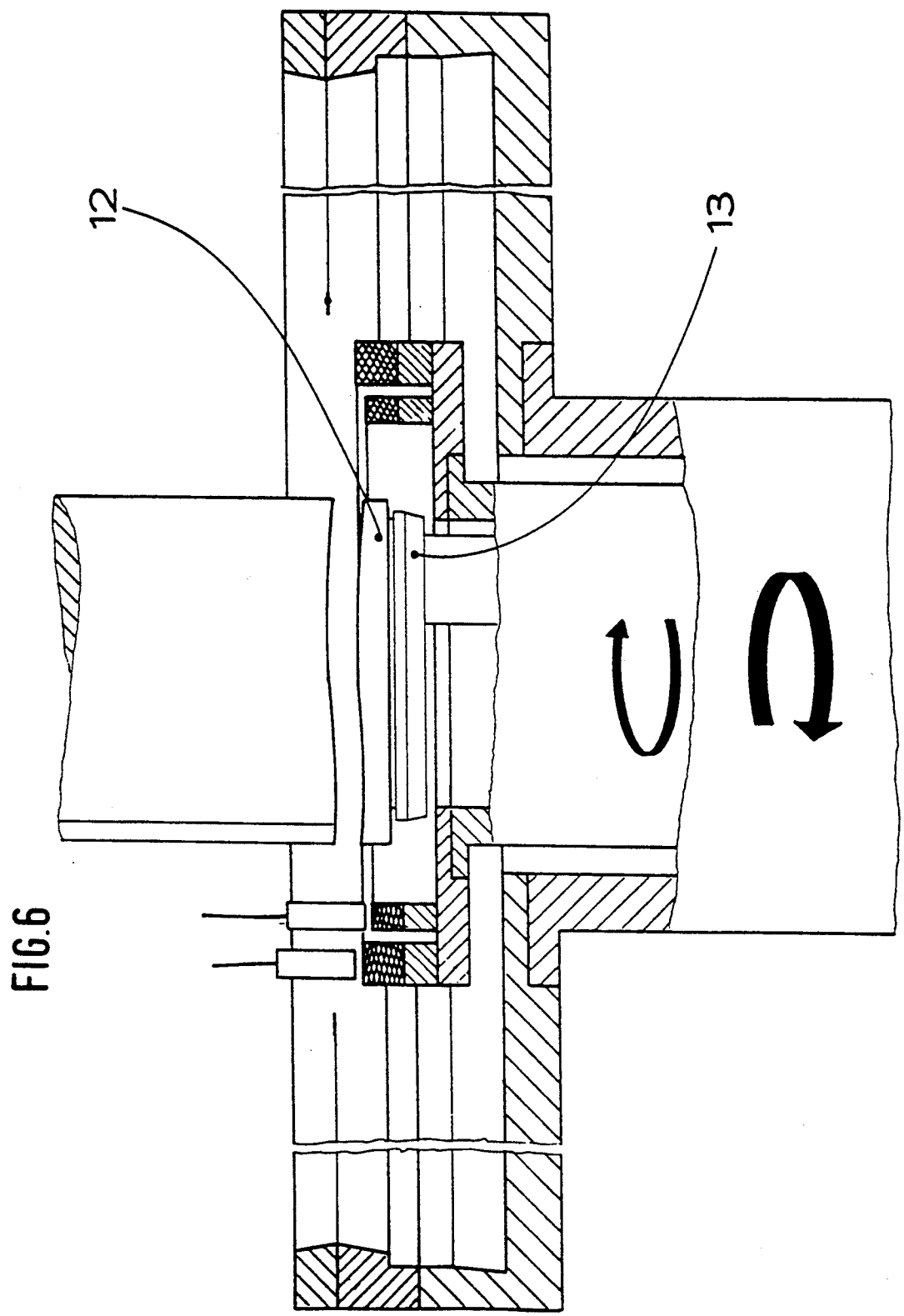

METHOD AND ARRANGEMENT FOR SUBDIVIDING SEMICONDUCTOR BARS INTO SEMICONDUCTOR WAFERS

BACKGROUND OF THE INVENTION

The invention relates to a method for subdividing cylindrical pieces of brittle non-metallic materials into wafer-form intermediate products. In this method, materials which have a Vicker hardness of up to HV 15000 N/mm$^2$ can be subdivided. In particular, the materials which can be subdivided are the substrate materials for electronic structural parts, for example silicon, germanium or gallium arsenide. These materials make extreme demands on the machining process due to their special material properties.

The method in accordance with the invention is particularly important for subdividing semiconductor bars into semiconductor wafers which are highly planar on one side and have optimum surface quality.

The invention also relates to a device for subdividing cylindrical pieces of brittle non-metallic materials into wafer-form intermediate products.

The semiconductor raw materials for the semi-finished product are molded in cylinder form called the "bars" or "ingots". In order to perform additional working on the bar, a subdivision or slicing of the bars into thin discs, called "rounds" or "wafers", is required. The process of slicing the bars makes increasingly higher demands with respect to dimensional accuracy and surface quality of the wafers obtained in this way. To achieve these higher demands, the wafers should be plane-parallel as much as possible. Furthermore, it is of particular importance that one of the two faces of the wafer is as planar as possible so that it can serve as a reference plane for subsequent working on the bar.

It is known from West German Patent DE 36 13 2 C2, corresponding to U.S. Pat. No. 4,896,459, granted Jan. 30, 1990, and West German Patent DE 37 37 54 0 C1, corresponding to U.S. Pat. Nos. 4,967,461 granted Nov. 6, 1990 and 4,881,518 granted Nov. 21, 1989, to provide a device which suggests a solution to the requirement for a planar reference surface. These devices provide for an integration of the slicing and planing processes wherein the front face of the bar which is uneven due to the preceding slicing process, is planed through a milling removal process before a further wafer is sliced. After a further slicing process, the face, planed in this way serves in the wafer generated therein as planar reference surface for the further working.

As described in the above-cited publications, the planing process of the bar front face is carried out by grinding. The slicing process is preferably accomplished by means of an internal-hole saw. As is further disclosed in the above-cited publications, under the aspect of productivity, an especially advantageous application resides in carrying out grinding and sawing processes simultaneously, or with only a slight time difference such that the grinding and sawing processes can be carried out utilizing the same advance motion.

However, this technique illustrated a significant limitation in prior art devices such as those mentioned above. This limitation is that since the slicing process is the more critical of the two processes, parallel operating steps are carried out with an optimum advance motion particular to the slicing process, i.e. that the flow and speed of motion is tuned especially to the slicing process. In the sense of the above stated productivity aspect, the grinding process is carried out utilizing the same advance motion, wherein the process conditions for the grinding process in the general case are not optimal.

In addition, in these prior art devices, the constructional and kinematic boundary conditions require that for the grinding process only plane-side longitudinal grinding is possible wherein the advance speed must be identical with that of the slicing process. These limiting boundary conditions significantly impair the surface quality of the grinding process in a lasting manner. In view of sufficient removal performance and permanent cutability, a relatively coarse grain must be selected for the grinding process on which the surface quality achieved thereby must, by necessity, be relatively coarse. For the further fabrication and additional working of the wafers, it would, however, be particularly advantageous if the plane surface of the wafers generated by grinding would already have a good surface quality that would meet the demands of the subsequent processes without intermediate working.

However, a fundamental problem of grinding technology is encountered. As is known in the art of grinding technology, either grinding takes place with a coarse grain tool and relatively large removal performance with relatively poor surface quality is obtained on the wafer, or grinding takes place with a fine grain tool and low removal performance with good surface quality. In the present case, the high demands of the slicing process and the advance speed connected therewith require a relatively high removal performance and, consequently, a coarse grain which by necessity generates a relatively rough surface on the workpiece. However, as already stated above, a fine surface would be desirable for the further processing and additional working of the wafers.

The standard attempt to provide solution in the art of grinding technology entails a two-stage working: pre-grinding with a coarse grain tool and then final-finishing working with a fine grain tool. However, the standard approach used in practice in this simple form is not usable here since two grinding tools in classic form under the given constructional boundary conditions, and utilizing the same advance motion, cannot act upon the same workpiece to thereby subdivide the semiconductor bar.

OBJECTS AND SUMMARY OF THE INVENTION

It is an object of the present invention to provide a new and improved method and device for longitudinal-side plane-grinding of a semiconductor bar and utilizing auxiliary means which combines a coarse-grain pre-grinding with high removal performance and a fine-grain final working with high surface quality utilizing a common advance motion.

It is another object of the invention to provide a new and improved method and device in which the processes of pre- and fine-grinding are carried out sequentially in time, but overlapping.

Briefly, the device in accordance with the invention comprises a grinding tool having two concentrically arranged grinding discs. A rough grinding disc is arranged inside of an outer smooth polishing grinding disc. The grinding tool grinds a lower face of a semiconductor bar to a smooth planar form. A first electrolytic truer operates in conjunction with the outer smooth polishing grinding disc while a second electrolytic truer operates in conjunction with the inner rough grinding disc. The truers are arranged to define an axial offset between the grinding disc so that a lower face of the bar is smoothed. The device also has a slicing tool for slicing the bar into wafers which will have a smooth planar form.

BRIEF DESCRIPTION OF THE DRAWINGS

The following drawings are illustrative of embodiments of the invention and are not meant to limit the scope of the invention as encompassed by the claims.

FIG. 3-6 are side elevation views of sequential positions of a single pass of a device in accordance with the invention.

DETAILED DESCRIPTION OF THE INVENTION

Figure 1:
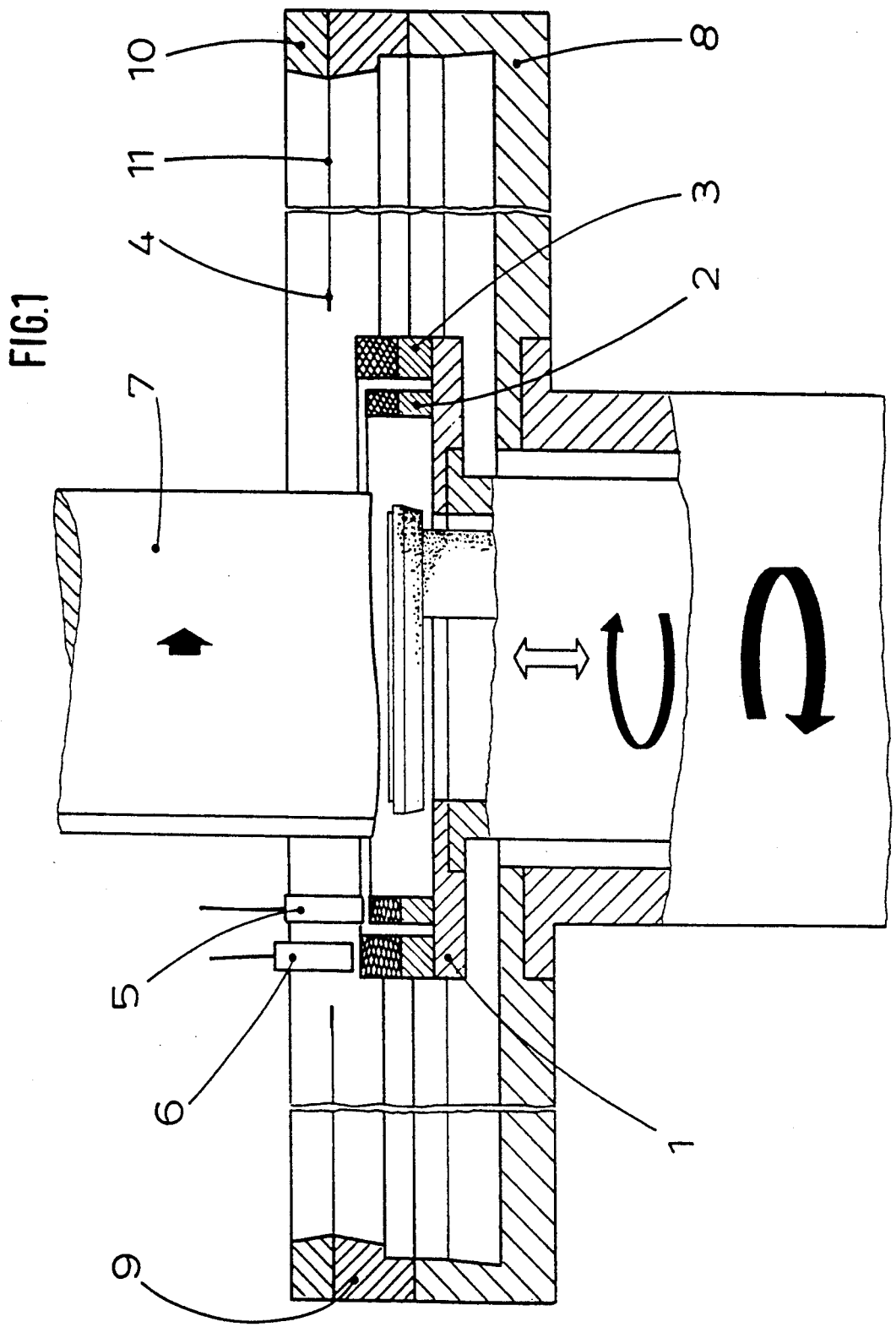
FIG. 1 is a side elevation view of a device in accordance with the invention in a starting position before the operation begins.

As illustrated in FIG. 1, the arrangement comprises essentially a grinding disc carrier 1 whose bearing has been omitted in this representation for the sake of clarity. Two annular grinding discs 2 and 3 are disposed concentrically to an axis of rotation of the grinding disk carrier 1 and at the external periphery of the grinding disc carrier 1. The grinding disc 2 is the roughing grinding disc and grinding disc 3 is the smooth-polishing grinding disc. The grinding disc carrier 1, With the grinding discs 2 and 3 attached thereto, is axially movable relative to the saw tool with the machining coating 4, or sawing coating. In this manner, the axial interspace between the front face of the grinding disk and the saw blade 11 with sawing coating 4 can be varied. The grinding discs 2, 3 are are each provided with a metallic binder and equipped with one trueing electrode 5 and 6 each, also referred to as electrolytic truers. The trueing electrodes 5, 6 are operated separately from one another. The roughing electrode 5 is arranged on the roughing disc 2 and the smooth-polishing electrode 6 is arranged on the smooth-polishing disc 3.

Figure 2:
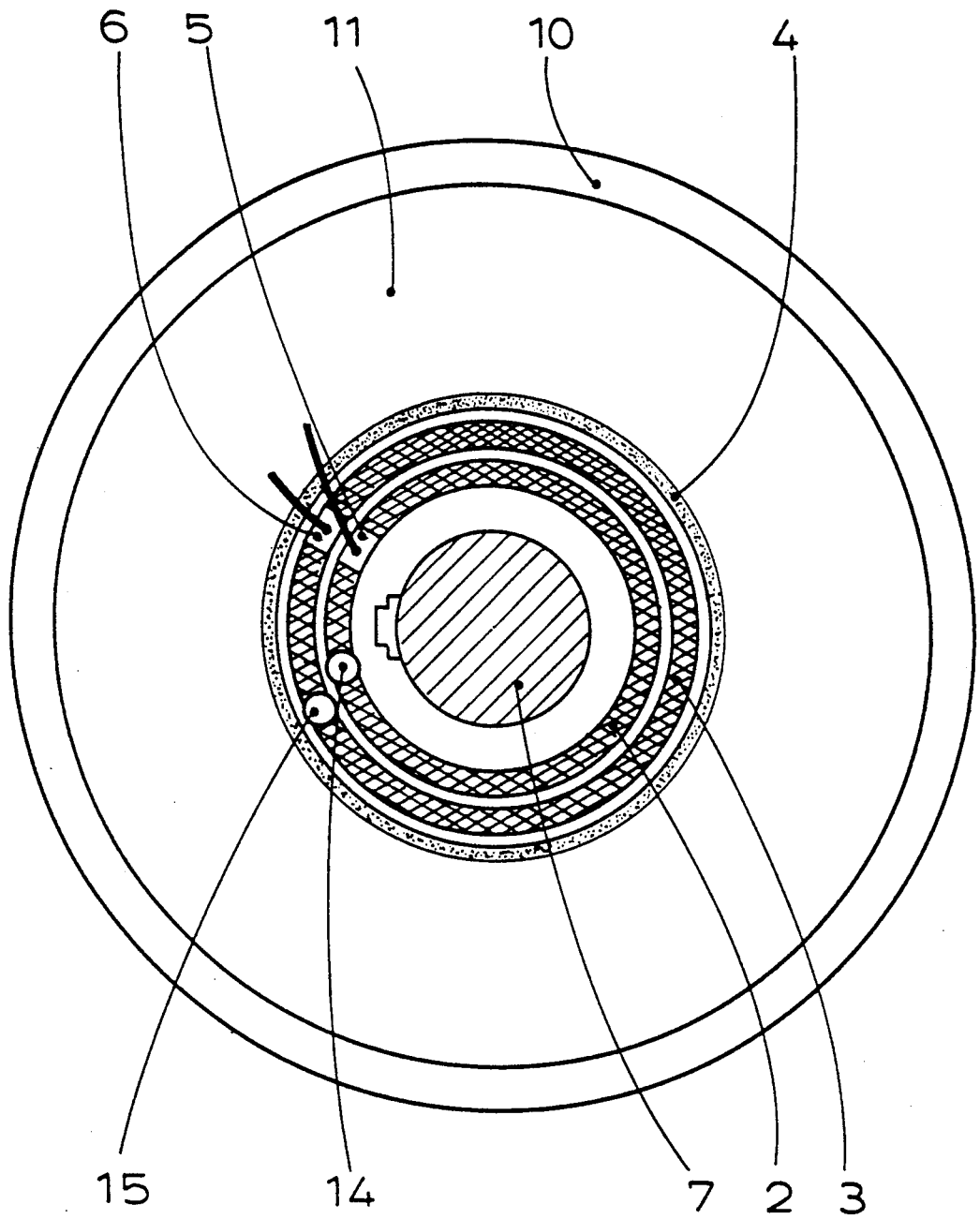
FIG. 2 is a top view of the embodiment illustrated in FIG. 1.

As illustrated in FIG. 2, the trueing electrode 5 acts on the internal grinding disc 2. A distance sensor 14 is located in the device to detect the axial position of the front face of the grinding disc 2. Similarly, the axial position of the front face of the grinding disc 3 is detected by the distance sensor 15. From the magnitude of the difference of the paths recorded by the two sensors 14 and 15, the axial offset of the front faces of the two grinding discs can be determined. This axial offset is extremely important in the grinding process.

Furthermore, the arrangement is supplemented by a slicing tool which is preferably an internal-hole saw. The rotating saw tool is schematically illustrated in FIG. 2. The sawing coating 4 which is disposed at a greater distance from the axis of rotation in a radial direction than the smooth-polishing disc 3. The sawing coating 4 is applied on an annular circle-form carrier sheet 11 which, in turn, is clamped between a lower clamping edge ring 9 and an upper clamping edge ring 10 and radially expanded by a mechanism not shown here. The two clamping edge rings 9, 10 are fixedly connected with a rotationally symmetrical basic body 8. The basic body 8 is supported relative to the machine frame and is arranged to rotate.

The sawing and grinding tools are supported in combination or individually with respect to their rotation motion but rotate in any case about a common axis. In the case of a combined support for the sawing and grinding tools, the direction of rotation and the number of rotations of both tools is, by necessity, identical. However, if the sawing and grinding tools are supported separately, the direction of rotation and number of rotations of both tools are generally different.

The following description of a single grinding-slicing process is intended to facilitate the understanding of the process and apparatus in accordance with the invention.

Referring to FIG. 1, at the beginning of the process, bar 7 is centrally positioned and shifted axially downward until the highest point of its front face is disposed just below the plane defined by the front face of the roughing disc 1. This highest point on the front face of the bar is generated by the preceding slicing process. The axial position of bar 7 is subsequently maintained for the entire duration of this working step.

Figure 3:
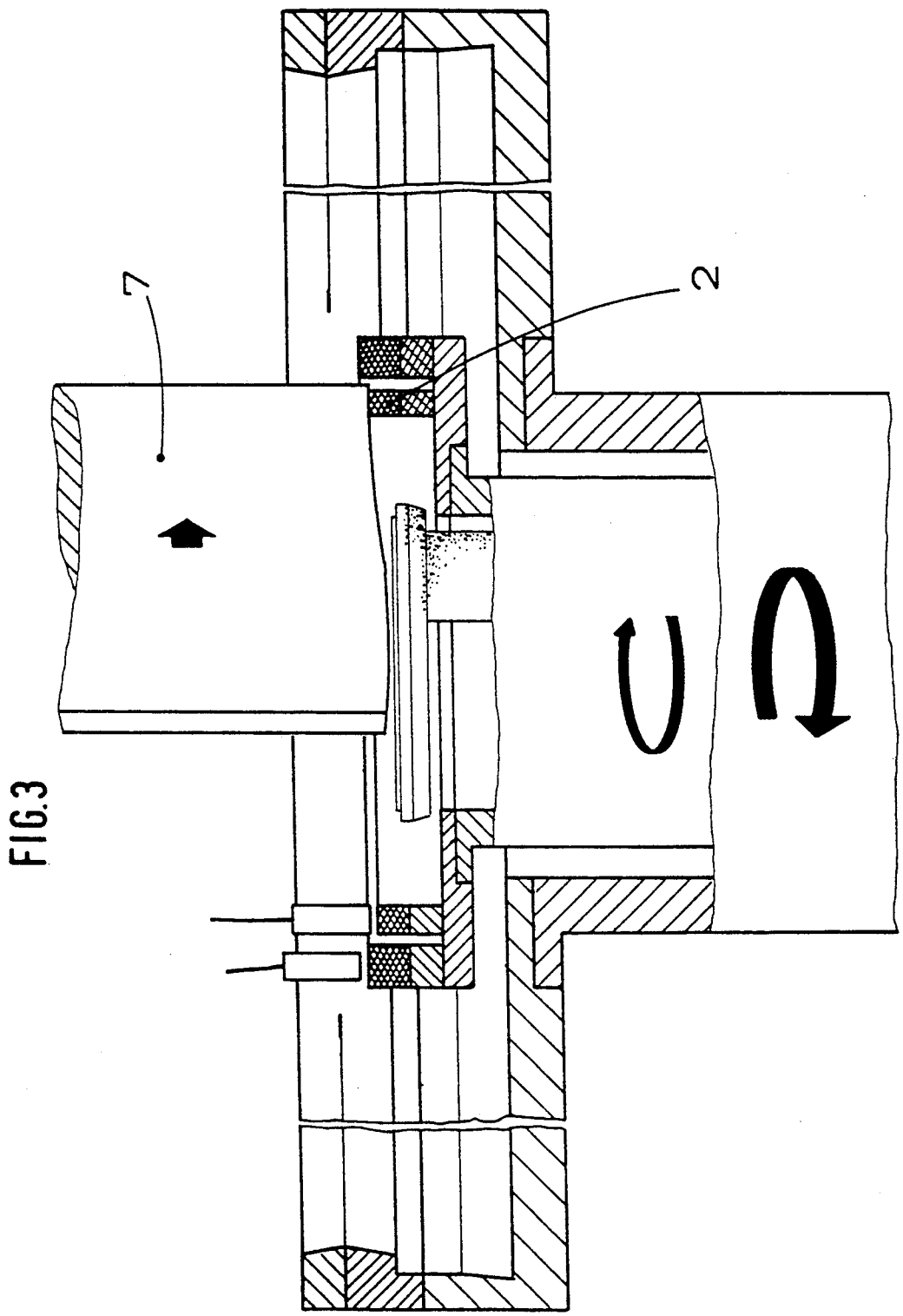
Figure 4:
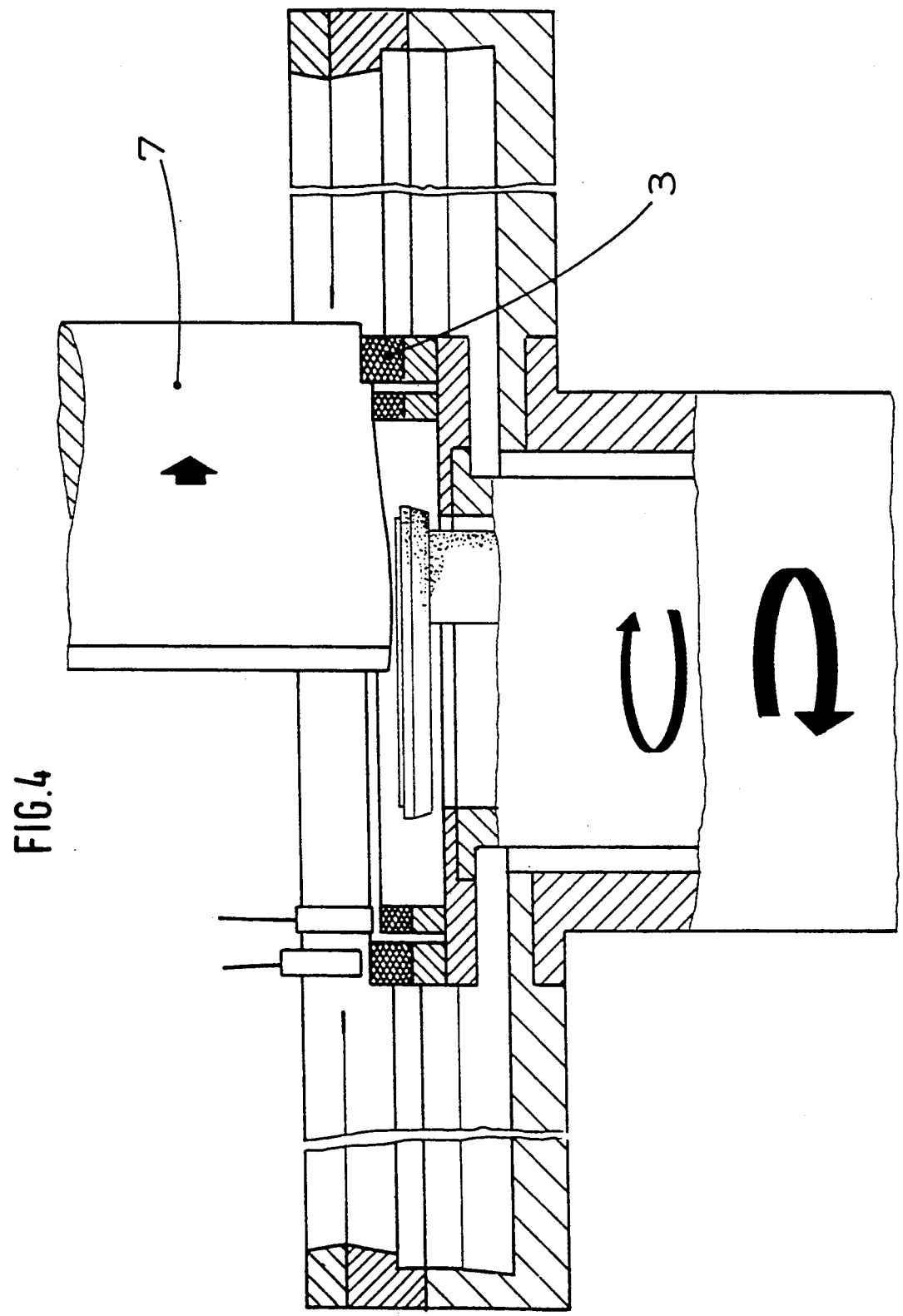

After being axially fixed, bar 7 is brought into a horizontal advance motion as seen in FIG. 3. In this position, the lower end of the bar 7 contacts the relatively coarse-grained roughing disc 2. The roughing disc 2 removes the bulk of the material during the planing process of the front face. As bar 7 continues in its horizontal advance motion, the bar 7 contacts the fine-grained smooth-polishing disc 3 (FIG. 4), which projects only slightly beyond the roughing disc 2. Although the removal performance of the smooth-polishing disc 3 is very low, the surface generated on the workpiece is very good due to the fine grain of the grinding disc 3.

Figure 5:
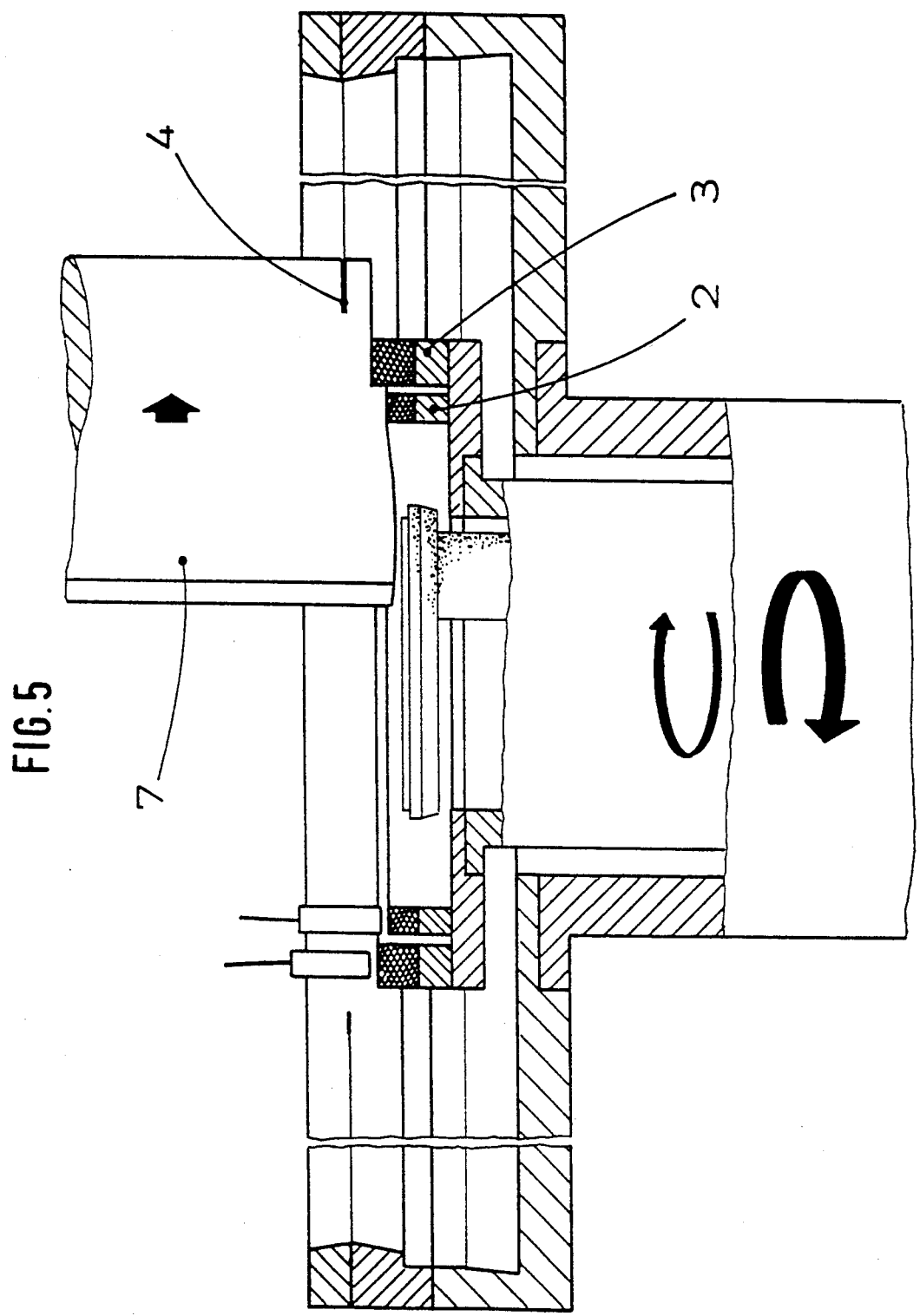

In the further course of advance motion, the bar 7 comes into contact with the sawing coating 4 of the blade of the internal-hole saw (FIG. 5). The distance between the upper edge of the smooth-polishing disc 3 and the lower edge of sawing coating 4 is adjustable through the relative axial displaceability of the grinding and slicing tools so that a wafer of the desired thickness is formed.

FIG. 6 depicts the state of the sliced wafer at the end of the slicing process. The underside 12a of the sliced wafer 12 is planar as a result of the very rigid guidance of the grinding tool and can consequently be utilized as reference surface in the further working passes of the semiconductor bar. In contrast, the upper surface of the wafer is, inter alia, uneven since the slicing tool is more resilient in the axial direction due to its geometric dimensions.

Both grinding tools are operated independently of each other with one electrolytic truer each. The operating parameters for the trueing electrode 6 of the smooth-polishing disc 3 are intended to work with finest-grain grinding discs in order to obtain the best possible surface quality. With the electrolytic truer during the grinding process, the metallic binder is continuously converted into metal oxide at its surface. In this manner, the blunt grinding grains can specifically break out of the weakened bond in order to make room for the sharp grains which move up.

The operation of the trueing electrode 5 for the roughing disc 2 follows the same principle as the trueing electrode 6 of the smooth polishing disc 3, however, trueing electrode 5 performs an entirely different function, namely controlling the cooperation between roughing disc 2 and smooth-polishing disc 3. A defined division of the material removal achieved by both discs is only possible if the axial offset between the grinding surfaces of the roughing disc 2 and smooth-polishing disc 3 can be precisely controlled. This magnitude must be maintained precisely, in order not to exceed the extremely small chip chamber volume of the smooth-polishing disc 3 and to avoid, at all times, clogging of the smooth-polishing disc 3.

The specific wear and tear of the roughing disc 2 is less than that of the smooth-polishing disc 3. Under otherwise identical constructional and operating conditions, the front faces of the grinding tool over the long term would adapt to each other whereas the smooth-polishing operation gradually would lose its ability to function. In order to be able to initially maintain the distance between the grinding surfaces of roughing disc 2 and smooth-polishing disc 3 even over a relatively long period of time, the roughing disc 2 is implemented so as to be smaller than the smooth-polishing disc 3. A fine adaptation of the axial distance of the front faces of both grinding disc can subsequently be carried out via the electrical operating data.

In this cooperation of the trueing of roughing disc 2 with electrode 5, on one hand, and smooth-polishing disc 3 with electrode 6, on the other hand, it should be considered that the electrical operating data for smooth-polishing disc 3 must be directed primarily toward maintaining the sharpness of the disc. This fact is not as important in the case of the roughing disc 2. The electrical operating data of the roughing disc 2 are especially optimized toward keeping the axial offset relative to the smooth-polishing disc at the desired level.

With the electrical operating data of the electrolytic truer 5 for the roughing disc 2 the binder removal at the roughing disc 2, is continuously accelerated or decelerated so that between the two grinding discs 2 and 3 the desired axial offset is created or maintained. For the precise control of the axial offset between roughing and smooth-polishing discs 2, 3, sensors 14 and 15 are required whose difference value is utilized as a signal for the electrical operating data of the roughing disc so that a closed control loop is obtained.

The illustrated embodiments refer to a combination of the grinding apparatus with an internal-hole saw, of which both rotate about a vertical axis. However, the same configuration of a grinding apparatus with an internal hole saw is also conceivable whereby the apparatus and saw rotate about a horizontal or otherwise disposed axis.

In addition to the above explanations, a combination of the above described grinding apparatus with other slicing processes is possible, such as for example wire or band saws. In principle, all further slicing processes are possible which work with individual cuts.

The examples provided above are not meant to be exclusive. Many other variations of the present invention would be obvious to those skilled in the art, and are contemplated to be within the scope of the appended claims.

I claim:

1. A device for subdividing semiconductor bars into semiconductor wafers comprising
    a grinding tool having two concentrically arranged grinding discs mounted for rotation around an axis of rotation, an inner one of said grinding discs being a roughing disc having a grinding surface situated in a first plane and an outer one of said grinding discs being a polishing disc having a grinding surface situated in a second plane which is axially offset with respect to said first plane in a direction of said axis of rotation, said grinding tool structured and arranged to grind a face of a semiconductor bar to a smooth planar form,
    a first electrolytic truer operating in conjunction with said polishing disc,
    a second electrolytic truer operating in conjunction with said roughing disc, said first and second truers being arranged to maintain an axial offset between said grinding surfaces of said roughing disc and said polishing disc, and
    a slicing tool for slicing the bar into wafers.
2. A device as claimed in claim 1, wherein said slicing tool is an internal-hole saw.
3. A device as claimed in claim 1, wherein said slicing tool is a band saw.
4. A device as claimed in claim 1, wherein said slicing tool is a wire saw.
5. A device as claimed in claim 1, wherein each of said grinding discs is provided with a metallic binder.
6. A device as claimed in claim 1, wherein said grinding tool is arranged such that said roughing disc engages the bar before said polishing disc.
7. A device as claimed in claim 1, wherein said first truer is arranged to adjust the grinding surface of said polishing disc to polish a surface of the face of the bar to a fine surface.
8. A device as claimed in claim 1, further comprising a first distance sensor to detect an axial position of the grinding surface of said roughing sic.
9. A device as claimed in claim 8, further comprising a second distance sensor to detect an axial position of the grinding surface of said polishing disc.
10. A device as claimed in claim 1, wherein said grinding tool is arranged on a grinding disc carrier, said grinding disc carrier being movable in a direction of said axis of rotation with respect to said slicing tool.
11. A method for subdividing semiconductor bars into semiconductor wafers comprising the step of:
    providing a grinding tool with two concentrically arranged grinding discs mounted for rotation about an axis of rotation including an inner roughing disc having a grinding surface situated in a first plane, and an outer polishing disc having a grinding surface situated in a second plane which is axially offset with respect to said firs plane in the direction of said axis of rotation,
    equipping the roughing disc with a first electrolytic truer,
    equipping the polishing disc with a second electrolytic truer, the first and second truers maintaining a axial offset of the grinding surfaces of the polishing disc and roughing disc at a precisely defined magnitude.,
    grinding a semiconductor bar by moving the bar over the roughing and polishing discs such that a smooth planar surface is formed, and
    slicing the bar by means of a slicing tool to form a wafer.
12. A method as claimed in claim 11, further comprising the steps of contacting the bar with the roughing disc and thereafter contacting the bar with the polishing disc such that a smooth planar surface is formed on bar.
13. A method as claimed in claim 1, wherein said grinding and slicing are performed at the same time.

* * * * *